United States Patent [19]
Kerner

[11] Patent Number: 5,269,146
[45] Date of Patent: Dec. 14, 1993

[54] THERMOELECTRIC CLOSED-LOOP HEAT EXCHANGE SYSTEM

[76] Inventor: James M. Kerner, 779 Hillgrove, Chico, Calif. 95926

[21] Appl. No.: 794,594

[22] Filed: Nov. 13, 1991

Related U.S. Application Data

[63] Continuation of Ser. No. 574,408, Aug. 28, 1990, abandoned.

[51] Int. Cl.$^5$ ............................................. F25B 21/02
[52] U.S. Cl. ........................................ 62/3.6; 62/3.62; 62/3.7; 165/104.33
[58] Field of Search .................. 62/3.6, 3.61, 3.62, 62/3.7, 236, 457.9; 165/80.4, 170, 140.33

[56] References Cited

U.S. PATENT DOCUMENTS

| | | |
|---|---|---|
| 1,120,781 | 12/1914 | Alkenkirch et al. . |
| 2,456,070 | 12/1948 | Malek et al. . |
| 2,898,743 | 8/1959 | Bradley .................................. 62/3.7 |
| 2,928,253 | 3/1960 | Lopp et al. . |
| 2,931,188 | 4/1960 | Levit . |
| 2,949,014 | 8/1960 | Belton, Jr. et al. . |
| 3,139,734 | 7/1964 | Kueckens et al. . |
| 3,154,926 | 11/1964 | Hirschhorn . |
| 3,205,667 | 9/1965 | Frantti ................................... 62/3.1 |
| 3,216,204 | 11/1965 | Milligan et al. ....................... 62/3.2 |
| 3,240,261 | 3/1966 | Morales . |
| 3,255,593 | 6/1966 | Newton . |
| 3,327,776 | 6/1967 | Butt .................................... 165/80.4 |
| 3,400,543 | 9/1968 | Ross . |
| 4,079,410 | 3/1978 | Schierz ............................... 165/80.4 |
| 4,384,512 | 5/1983 | Keith . |
| 4,493,441 | 1/1985 | Sedam et al. . |
| 4,576,009 | 3/1986 | Ogushi et al. . |
| 4,593,529 | 6/1986 | Birochik . |
| 4,624,395 | 11/1986 | Baron et al. . |
| 4,744,220 | 5/1988 | Kerner et al. .............................. 62/3 |
| 4,752,389 | 6/1988 | Burrows . |
| 4,792,059 | 12/1988 | Kerner et al. . |
| 4,833,888 | 5/1989 | Kerner et al. ........................... 62/3.3 |

FOREIGN PATENT DOCUMENTS

| | | | |
|---|---|---|---|
| 1135016 | 8/1962 | Fed. Rep. of Germany ......... | 62/3.6 |
| 552479 | 3/1977 | U.S.S.R. ............................... | 62/3.61 |

*Primary Examiner*—Albert W. Davis, Jr.
*Attorney, Agent, or Firm*—Ron Fish

[57] ABSTRACT

The present invention is a closed-loop cooling system in combination with a thermoelectric heat exchanger whereby heat exchange liquid provides quick and efficient heat exchange with a thermoelectric device and is heated or cooled by passing the heat exchange liquid through an air core heat exchanger by energy efficient pump means. In a cooling system, heated water from the heat exchanger is pumped through an air core heat exchanger and then recirculated through a labyrinthine cooling block in thermal communication with the thermoelectric device. The labyrinth within the cooling block is of low back pressure to minimize the amount of energy required to pump the liquid. The liquid-driven rapid heat exchange and the pumping assures circulation and the closed system assures that the liquid is not wasted or lost. The process is carried out without phase change. An apparatus incorporating the invention can be battery-operated and portable and may provide cooling solutions for specific applications where large temperature differentials may be maintained and/or precision temperature control is important in a portable environment. Where the speed of circulation is high and the internal back pressure of the heat exchange liquid is low, there is least expenditure of energy in a closed system.

18 Claims, 2 Drawing Sheets

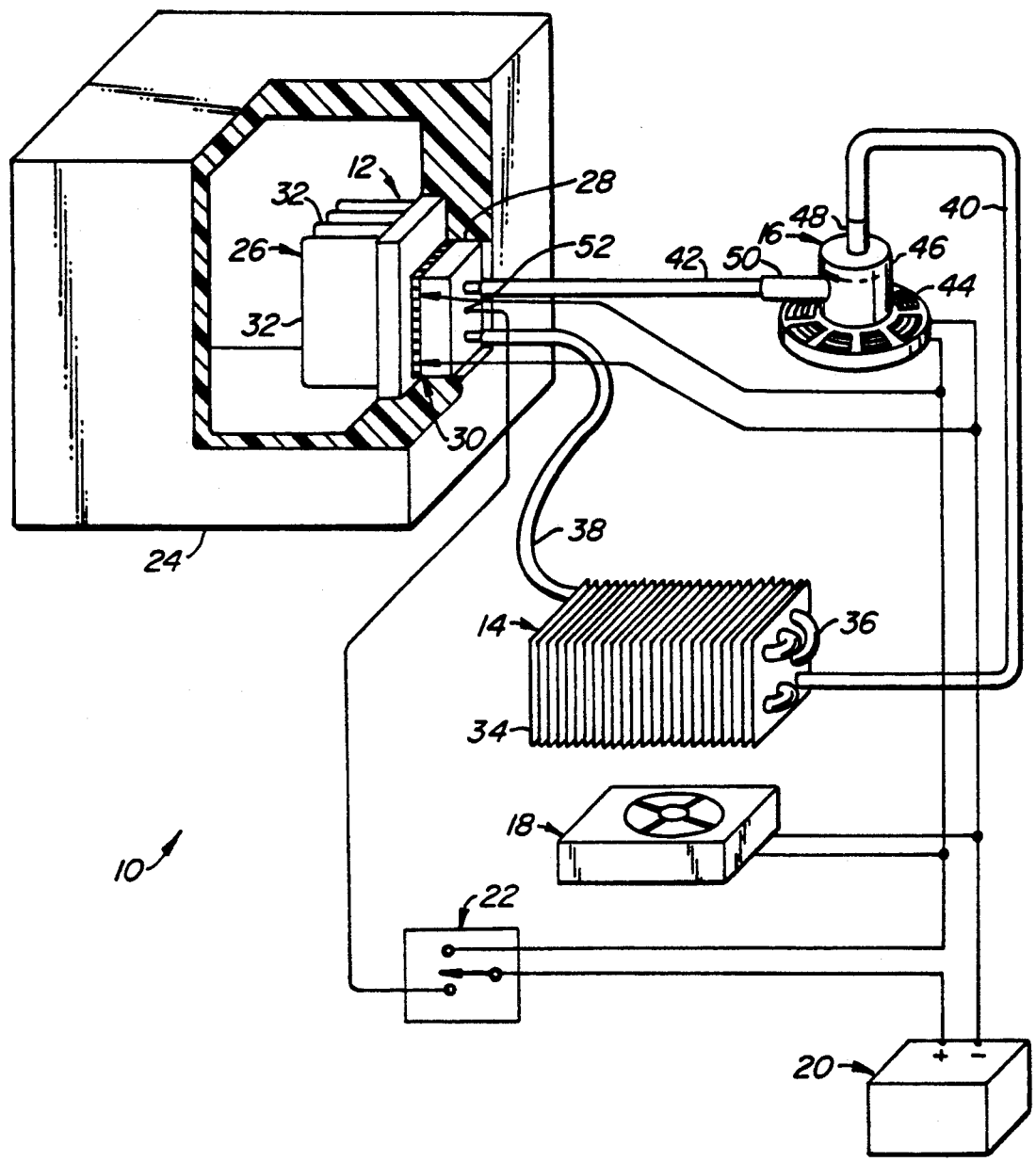
FIG._1.

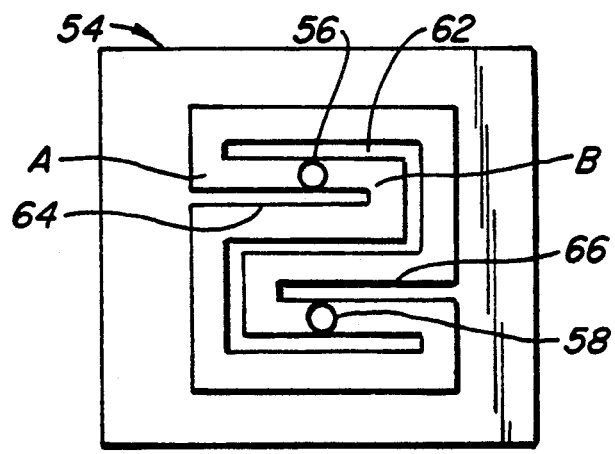
FIG._2.
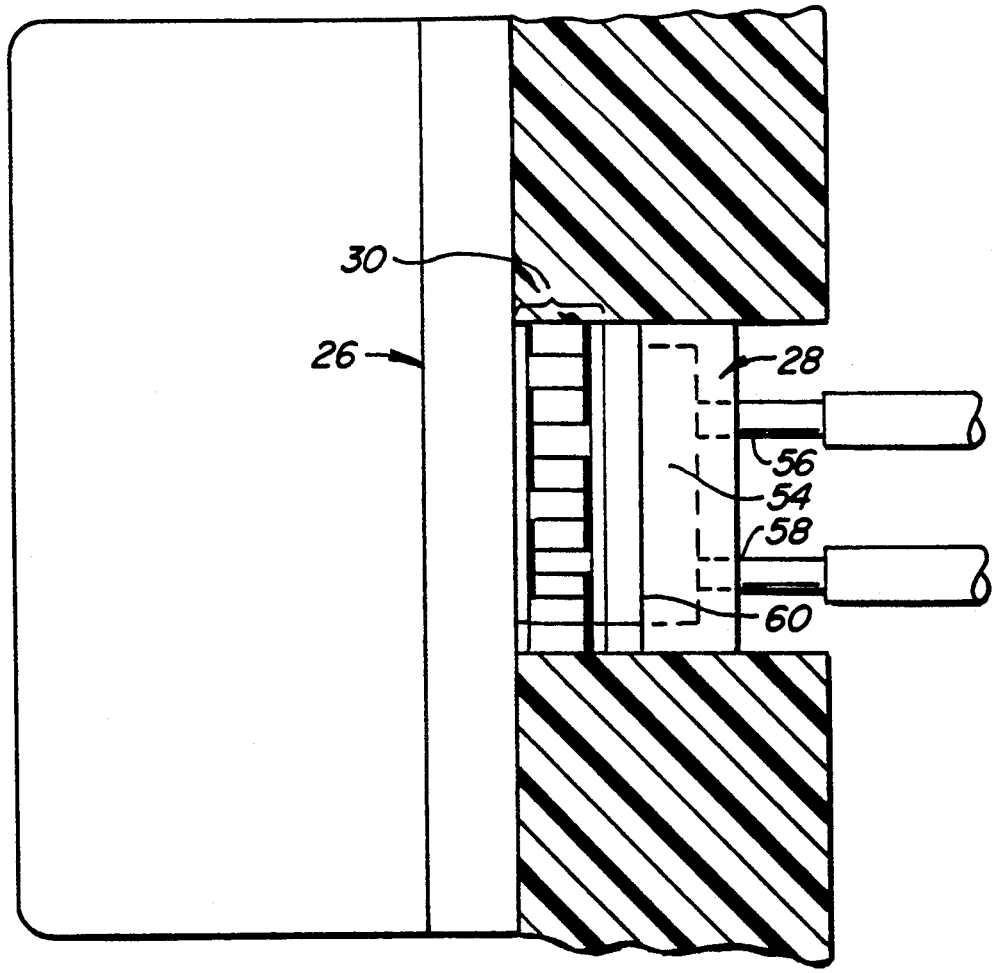
FIG._3.

THERMOELECTRIC CLOSED-LOOP HEAT EXCHANGE SYSTEM

This application is a continuation of application Ser. No. 07/574,408, filed Aug. 28, 1990, now abandoned.

BACKGROUND OF THE INVENTION

This invention relates to a thermoelectric heat exchange apparatus and, more particularly, to an apparatus for thermoelectrically cooling a system in order to maximize the differential of temperature with minimum energy expenditure, particularly for applications requiring portability.

Thermoelectric systems generally comprise an insulated chamber having an interface to one side of a Peltier thermoelectric device and an interface on the other side of the Peltier device to a heat exchanger with the ambient environment. Peltier devices can operate either as heaters or coolers or even in the presence of an established differential of temperature operate as a means for generating DC electricity. In the application of interest herein, the Peltier device is used either as a heater or cooler.

There are many applications for thermoelectric heat exchanges which place a premium on efficiency and portability. There are, for example, portable ice or refrigeration chests, refrigerated or heated bottles, ice cream and other serving machines, icemakers, water chillers, microcooling applications such as spot cooling in electronics, instrument environments, calibration environments, medical transport chambers and even serving carts for hotels and restaurants. Thermoelectrics are advantageous under circumstances where precise temperature control is an objective.

Thermoelectric cooling devices are also particularly advantageous in environments where the elimination of CFC's is an objective, since thermoelectrics do not require the use of expansion gasses to produce the cooling effect.

One conventional design of the thermoelectric ambient interface is the use of a finned extender block whereby ambient air cools the finned block by convection. This type of cooling is relatively inefficient in that it is difficult to exhaust large quantities of heat rapidly and thereby establish a large temperature differential with adequate heat pumping. The application of power through a thermoelectric device is a function of the desired heat pump effect and differential of temperature. It is therefore highly desirable to exhaust as much excess heat in the cooling system as possible to maximize the temperature differential while handling the heat load. In this manner, the electric power expenditure can also be minimized.

Thermoelectric cooling systems using liquid as a heat exchange medium are known. For example, U.S. Pat. No. 4,744,220 to James M. Kerner and others, issued May 17, 1988, describes a thermoelectric heating and/or cooling system by using liquid for heat exchange in which the application is an insulated reservoir of drinking water wherein heat is pumped from a thermoelectric module by thin sheets of water flowing across the heated cooling block of the thermoelectric device. As described therein, the cooling liquid is assumed to be an infinite supply from an ambient source. Such a source would be a domestic water supply. A related U.S. Patent to Kerner, et al. '220, is U.S. Pat. No. 4,833,888 issued May 30, 1989.

One of the drawbacks of the use of thin sheets of water for cooling in the systems described therein is substantial back pressure requiring that a pump of significant power be used to force the cooling liquid to flow through the cooling block. As a consequence, there may well be a substantial and possibly an excessive expenditure of electric power to drive the pump.

What is needed is a thermoelectric heat exchanger which is efficient in operation and does not expend excessive amounts of power or expend cooling fluid and yet which is capable of quickly exchanging heat with the thermoelectric device to maintain high heat pumping efficiency and high temperature differentials.

A number of patents have been uncovered in a search of the prior art of the U.S. Patent and Trademark Office.

| Inventor | U.S. Pat. No. | Issue Date |
| --- | --- | --- |
| Malek et al. | 2,456,070 | December 14, 1948 |
| Newton | 3,255,593 | June 14, 1966 |
| Morales | 3,240,261 | March 16, 1966 |
| Belton, Jr. et al. | 2,949,014 | August 16, 1960 |
| Hirschhorn | 3,154,926 | September 25, 1962 |
| Milligan et al. | 3,216,204 | November 9, 1965 |
| Ogushi et al. | 4,576,009 | March 18, 1986 |
| Ross | 3,400,543 | September 10, 1968 |
| Kueckens et al. | 3,139,734 | July 7, 1964 |
| Levit | 2,931,188 | April 5, 1960 |
| Lopp et al. | 2,928,253 | March 15, 1960 |
| Alkenkirch et al. | 1,120,781 | December 15, 1914 |

The Malek et al. patent describes a thermoelectric device wherein hot junctions are cooled by immersion in a bath of liquid contained in a container. Rather than the liquid flowing past the hot junction, the liquid is heated to a vapor or steam phase and the vapor is passed through a conduit to a condenser. Ambient air cools the condenser so that the vapor is condensed to the liquid phase and returned to the container. The condenser may be a radiator type. The Malek invention is a system wherein a phase change is contemplated to effect cooling.

The Newton patent describes a thermoelectric module which is cooled by means of a liquid cooled heat exchanger with a recirculating pump wherein the liquid is circulated through a cooling tower which is intended to exhaust to the open atmosphere. The system is not truly a closed system and expects a certain amount of loss of coolant to the atmosphere through evaporation, which has to be made up and makes it totally unsuitable for a portable system.

The Morales patent discloses a closed-loop system for cooling thermoelectric modules wherein a pump circulates fluid to a liquid-to-liquid heat exchanger wherein in the secondary loop, the cooling water is used only once. This system does not resolve the basic problem of eliminating the excessive waste of water.

The Belton, Jr. et al. patent describes a thermoelectric air conditioning apparatus wherein secondary cooling is achieved by a water tower having water sprays in a system basically similar to the Morales device. This is not a truly closed-loop liquid cooling system.

The Hirschhorn patent describes a closed-loop type of system wherein the thermoelectric modules are cooled in a bath of liquid. A pump is used to circulate liquids through tubes having conductive wires therebetween. The purpose is a cooling blanket used to cool bodies in connection with surgical operations.

The Milligan et al. patent shows various embodiments of thermoelectric cooling devices for cooling a chamber, one of which is a closed-loop cooling system which includes a refrigerating fluid in contact with fins of a thermoelectric module. In this system, fluid is vaporized by heat from the fins and is passed through a conduit into a condenser where it is convectively air-cooled and flows by gravity back to an evaporator.

The Ogushi et al., patent describes a closed-loop system that uses both gas and liquid within a loop. Heat is absorbed in a liquid heat-receiving portion to form a gas or vapor, and the gas is directed to a heat-radiating portion having a fan to expedite cooling. Gas condenses to liquid and is directed to an accumulator on opposite sides of a thermoelectric module.

The Ross patent describes a system for cooling power devices of semi-conductor material which generate heat as a result of application of electrical power. In this system there is no provision for addressing the problem of energy efficiency. Further, it is not applicable to the special structures of thermoelectric coolers.

The Kueckens et al. patent describes a system for controlling Peltier elements in which the Peltier elements are described as batteries and in which one side of the Peltier element is immersed in a cooling liquid in an open container.

The Levit patent describes a Peltier device-based fluid cooling system which recirculates water to be cooled as a cooling fluid in an open-loop system. The system relies on heat radiators formed by finned pipes for ultimate heat exchange. The system is not closed.

The Lopp patent describes a thermoelectric cooler or heater for heating and cooling separate bodies of fluids.

The Alkenkirch et al., patent describes an early thermoelectric heating and cooling structure.

SUMMARY OF THE INVENTION

According to the invention, a closed-loop cooling system is provided in combination with a thermoelectric heat exchanger whereby heat exchange liquid provides quick and efficient heat exchange with a thermoelectric device and is heated or cooled by passing the heat exchange liquid through an air core heat exchanger by energy efficient pump means. In a cooling system, heated water from the heat exchanger is pumped through an air core heat exchanger and then recirculated through a labyrinthine cooling block in thermal communication with the thermoelectric device. The labyrinth within the cooling block is of low back pressure to minimize the amount of energy required to pump the liquid. The liquid-driven rapid heat exchange and the pumping assures circulation and the closed system assures that the liquid is not wasted or lost. The process is carried out without phase change. An apparatus incorporating the invention can be battery-operated and portable and may provide cooling solutions for specific applications where large temperature differentials may be maintained and/or precision temperature control is important in a portable environment. Where the speed of circulation is high and the internal back pressure of the heat exchange liquid is low, there is least expenditure of energy in a closed system.

The invention will be better understood by reference to the following detailed description in connection with the accompanying drawings.

BRIEF DESCRIPTION OF THE DRAWINGS

FIG. 1 is a pictorial diagram showing the elements of an apparatus according to the invention;

FIG. 2 is a top-plan view of the internal pattern of a heat exchange block showing passages in accordance with the invention; and FIG. 3 is a side-view and partial cross-section illustrating the heat exchange interface.

DETAILED DESCRIPTION OF SPECIFIC EMBODIMENTS

In FIG. 1 there is shown a heat exchange apparatus 10 in accordance with the invention. The heat exchange apparatus 10 comprises a thermoelectric heat exchanger 12, a liquid-air heat exchanger 14, a D.C. pump 16, a D.C. fan 18, a D.C. power supply 20, and a thermal switch 22.

The thermoelectric heat exchanger 12 is mounted in an insulated chamber 24 with a first heat exchange side 26 disposed within the insulated chamber 24 and a second heat exchange side 28 having a liquid circulation system therein as explained hereinafter. The active cooling or heating element is a thermoelectric Peltier device 30 positioned between first and second heat exchange sides 26 and 28.

Peltier devices are available commercially from Material Electronics Products Corporation (Melcor of Trenton, N.J.) in rectangular wafer-like semiconductor-based structures which produce either heating or cooling depending on the directional flow of direct electric current in accordance with the Peltier Effect. The amount of heat load and the current determine the maintainable temperature differential across the Peltier device. In a cooling system, for example, the first heat exchange side is cooled while the second heat exchange side is warmed. These blocks of material are thermally insulated from one another except through the Peltier device 30 itself. The first heat exchange side 26 may have fins 32 to establish an interface with the environment to be cooled. In a refrigerating chamber, the first heat exchange side 26 may be an L-block of metallic material such that material to be cooled may rest upon or against a portion of the L-block and be conductively cooled.

In accordance with the invention, the second heat exchange side 28 is a relatively low thermal mass structure through which a cooling liquid is recirculated with minimal back pressure and at moderate laminer or turbulent flow rates. Further, according to the invention, the cooling liquid is supplied in a closed loop from D.C. pump 16 through the internal circulation paths of the second heat exchange side 28 to liquid-air heat exchanger 14 having cooling fins 34 in thermally-conductive contact with heat exchange pipes 36. The liquid-air heat exchanger 14 is coupled to the block of the second heat exchange side 28 by a conduit 38 and to the pump 16 by a conduit 40. The pump 16 is coupled to the block of the second heat exchange side 28 by a conduit 42.

D.C. pump 16 may be an impeller pump having a magnetically-coupled impeller with D.C. windings 44 circumscribing the pump housing 46. Cooling liquid is taken into the pump 16 through an axial inlet 48 and expelled under relatively low pressure but high flow rate through an outlet 50 on conduit 42.

The fan 18 is disposed adjacent the heat exchanger 14 to force ambient air through the heat exchanger 14 to expedite heat exchange with the liquid in the heat exchanger 14. The entire system is operated at D.C. power from battery 20.

A thermocouple 52 may be mounted in the block of the second heat exchange side 28 to monitor temperature and control the thermal switch 22. All of the D.C. devices may optionally be connected electrically in parallel across the battery 20. Alternatively, more sophisticated control systems may be implemented wherein the temperature interior of the chamber 24 is monitored to control the thermal switch 22 which in turn may individually control the fan 18, the pump 16 and the Peltier device 30.

In order to promote the low-pressure flow of high-velocity, high-flow-rate fluid through the second heat exchange side 28, and yet promote high heat exchange through the second heat exchange side 28, an internal chamber 54 therein is formed as shown in FIG. 2. The internal chamber 54 comprises a serpentine path between an inlet 56 and outlet 58 within chamber 54 which is preferably at least half again as deep as wide, the width being the dimension which confronts a cooling plate 60 (FIG. 3) which in turn is juxtaposed to the Peltier device 30. The chamber is preferably a double S pattern in which the barrier 62 forms an S as viewed in FIG. 2 with cavity-bounded fingers 64 and 66 intersticed in the segments of the S formed by 62. Thus, two flow paths of equal length A and B are defined between the inlet 56 and the outlet 58. The paths have sufficient width and depth to permit essentially laminar flow of liquid at flow rates of interest between inlet 56 and outlet 58 in either direction.

Rapid, low-pressure liquid flowing through chamber 54 promotes the rapid heat exchange between the Peltier device and the ambient environment. As a consequence, the retention of heat near the Peltier device 30 on the heat exchange side in thermal communication with the ambient environment is minimized. More importantly, the liquid is flowed quickly and without any loss to the environment and can be reused as needed. The efficient use of an air radiator (i.e., with a fan) assures that no other heat exchange is needed.

The heat exchange capacity of the liquid-air heat exchanger (radiator) 14 is sufficient to maintain a temperature differential with the thermoelectric Peltier device 30 under design conditions. Thus, liquid is not wasted and the other deleterious effects of other types of refrigeration systems including lack of portability and the use of undesirable liquids has been avoided. The rapid and low-back pressure flow of liquid in the system minimizes the amount of energy expended for active circulation and also reduces the load on the thermoelectric Peltier device 30. As a consequence, the entire heat exchange apparatus 10 can be rendered portable with sufficient efficiency to be battery-operated for long periods and, depending on battery weight and size of components, be relatively light in weight as compared to other heat exchange systems, particularly compressor-type refrigeration systems of conventional design and of comparable heat exchange capacity.

The invention has now been explained with reference to specific embodiments. Other embodiments will be apparent to those of ordinary skill in the art. For example, the system may employ A.C. power components suitable for portable or stationary applications. It is therefore not intended that this invention be limited except as indicated by the appended claims.

What is claimed is:

1. An apparatus for exchanging heat with a reservoir comprising:
    a thermally insulated container having at least one wall enclosing a chamber to be cooled thermoelectrically;
    a thermoelectric device mounted in one wall of said thermally insulated container, and having a first heat exchange side and a second heat exchange side, said first heat exchange side being thermally coupled to said chamber to be cooled, said second heat exchange side being thermally coupled with an ambient environment;
    said second heat exchange side including heat exchange block thermally coupled to said second heat exchange side of said thermoelectric device and having approximately the same area as said second heat exchange side, and having a fluid inlet coupled to a fluid outlet by a fluid passageway having sufficient width and depth to promote high velocity, high flow rate flow with a low pressure drop from said fluid inlet to said fluid outlet, said fluid inlet and said fluid outlet being coupled by pipes that do not pass through the insulated wall or walls of said container any further than necessary to reach the ambient where they couple to a closed-loop liquid cooling system, said closed-loop liquid cooling system located outside said thermally insulated container such that heat dissipated by said closed-loop liquid cooling system does not heat said thermally insulated container, said closed-loop liquid cooling system comprising:
    a heat exchanger; and
    a forced convection pump coupled by pipes to said fluid inlet and outlet of said heat exchange block and to said heat exchanger so as to force circulation of liquid coolant from said heat exchange block through said heat exchanger and, thereafter, back through said heat exchanger block thereby promoting rapid heat exchange between said thermoelectric device and the ambient environment;
    a coolant pumped by said pump in said closed-loop liquid cooling system; and
    a power supply coupled to said pump and said thermoelectric device.

2. The apparatus according to claim 1 wherein a cooling fan is disposed adjacent said heat exchanger for promoting the flow of ambient air through said liquid-air heat exchanger, said liquid-air heat exchanger being formed of heat exchanging conduits thermally coupled to cooling fins.

3. The apparatus according to claim 2 wherein said pump and said fan are D.C. devices, said D.C. devices being coupled to a common power source with said thermoelectric device.

4. The apparatus according to claim 2 wherein said heat exchange block comprises a high thermal conductivity metal block having a chamber therein for receiving said coolant, the chamber comprising a pattern of intertwined, serpentine fluid channels formed in said metal heat exchange block and juxtaposed and thermally coupled to said thermoelectric device, said pattern of fluid channels defining a cavity providing minimal back pressure to flow of said coolant and thermally coupled thereto, and wherein said pump has a power such that fluid velocity through the metal heat exchanger block is low enough to promote laminar flow given the dimensions of said fluid channels.

5. The apparatus according to claim 4 wherein said fluid passageways in said metal exchange block define a flow path having relatively low back pressure and high-volume capacity to permit relatively rapid flow of cooling liquid through said chamber.

6. The apparatus according to claim 5 wherein said chamber defines two flow channels defining a double S pattern having flow paths of equal length between said fluid inlet and said fluid outlet.

7. The apparatus according to claim 6 wherein said power supply is a portable d.c. power source.

8. The apparatus according to claim 1 wherein said thermoelectric device is a Peltier junction device.

9. A thermoelectric closed loop cooling apparatus comprising:
- a container or other device to be cooled having one or more insulated walls enclosing a chamber;
- a Peltier junction thermoelectric cooling device having first and second sides, said first side thermally coupled to said chamber, for pumping heat from said first side to said second side when current is passed through said Peltier junction in the appropriate direction;
- a heat exchange block thermally coupled to said second side and having a low back-pressure fluid passageway formed therein and having an area which is preferably the same as the area of said Peltier junction thermoelectric cooling device and is not greater than twice the area of said Peltier junction thermoelectric cooling device;
- a radiator located outside said container for receiving heated coolant from said heat exchange block via fluid conduit that is not routed through said insulated walls any more than necessary to pass through said insulated walls by approximately the shortest route, said radiator means for radiating heat therefrom so as to cool said coolant; and
- a pump coupled to said radiator and said heat exchanger block fluid passageway for forcing circulation of said coolant from said radiator through said heat exchange block and back to said radiator; and
- a power supply coupled to said pump and said Peltier junction thermoelectric cooling device.

10. The apparatus of claim 9 wherein said pump is a portable driven pump, and wherein said power supply is a portable battery.

11. The apparatus of claim 9 wherein said pump is any type pump that can generate a sufficient flow rate such that a heat transfer coefficient characterizing the quantity of heat energy transferred for a given temperature differential generated by said thermoelectric cooling device is appreciably greater than the heat transfer coefficient of natural convection flow of said coolant.

12. The apparatus of claim 11 wherein said chamber is an ice box.

13. The apparatus of claim 9 wherein said pump has a sufficient power to create high velocity flow inside said heat exchange block.

14. The apparatus of claim 9 wherein said pump and the dimensions of said fluid passageway in said heat exchange block are such as to create laminar, high-volume, high velocity flow of said coolant through said heat exchange block.

15. The apparatus of claim 9 wherein said heat exchange block contains at least two separate fluid flow passageways between a fluid inlet coupled to said pump and a fluid outlet coupled to said radiator, said at two fluid flow passageways combining to lower the pressure drop across said metal block heat exchanger thereby lowering the resistance to flow therethrough such that greater flow rate can be achieved therethrough for any given pump power.

16. An apparatus for cooling an insulated chamber, comprising:
- a chamber enclosed by one or more walls of insulating material;
- a thermoelectric device which transfers heat from a cooled side to a heated side when current is passed through said thermoelectric device in a predetermined direction, said thermoelectric device mounted so as to have said cooled side thermally coupled to said chamber via a first finned heat exchanger;
- a heat exchange block thermally coupled to said heated side of said thermoelectric device, and having a fluid passageway therein coupled to a fluid inlet and a fluid outlet, said heat exchange block and said thermoelectric device preferably having substantially the same area but said heat exchange block having no more than twice the area of said thermoelectric device;
- a second heat exchanger having a fluid inlet and outlet coupled to said fluid outlet and inlet, respectively, of said heat exchange block via pipes which form a closed loop fluid circuit, said second heat exchanger and said pipes being located relative to said chamber so as to not cause substantial heat leakage therefrom back into said chamber;
- a fluid coolant;
- a pump coupled in said closed loop fluid circuit to circulate said fluid coolant by forced convection and located relative to said chamber so as to not cause substantial heat leakage therefrom back into said chamber; and
- a power supply or battery to provide current to said thermoelectric device and said pump.

17. The apparatus of claim 16 further comprising a fan which blows air through said second heat exchanger.

18. The apparatus of claim 16 wherein said second heat exchanger is located such that heat liberated therefrom does not substantially heat any wall of said chamber, and wherein said pipes have very little if any thermal coupling to said chamber.

* * * * *